US 011588458B2

(12) United States Patent
Vigilante et al.

(10) Patent No.: US 11,588,458 B2
(45) Date of Patent: Feb. 21, 2023

(54) VARIABLE GAIN CONTROL SYSTEM AND METHOD FOR AN AMPLIFIER

(71) Applicant: QUALCOMM INCORPORATED, San Diego, CA (US)

(72) Inventors: Marco Vigilante, San Diego, CA (US); Chinmaya Mishra, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 129 days.

(21) Appl. No.: 17/127,242

(22) Filed: Dec. 18, 2020

(65) Prior Publication Data
US 2022/0200557 A1    Jun. 23, 2022

(51) Int. Cl.
H03F 3/19 (2006.01)
H03G 3/30 (2006.01)
H03F 3/193 (2006.01)
H03F 3/21 (2006.01)
H03H 11/30 (2006.01)

(52) U.S. Cl.
CPC .......... H03G 3/3042 (2013.01); H03F 3/193 (2013.01); H03F 3/21 (2013.01); H03H 11/30 (2013.01)

(58) Field of Classification Search
CPC .................. H03G 3/3042; H03F 3/193
See application file for complete search history.

(56) References Cited

U.S. PATENT DOCUMENTS

| 3,778,646 | A  | * | 12/1973 | Masaki ............... H03K 19/086 326/89 |
| 3,805,093 | A  | * | 4/1974  | Hodemaekers ...... H03K 3/2897 323/317 |
| 3,949,317 | A  | * | 4/1976  | Crosby .................... H03K 6/02 330/258 |
| 5,926,509 | A  | * | 7/1999  | Stewart ................. H03F 3/3432 348/613 |
| 6,429,700 | B1 | * | 8/2002  | Yang ................... H03F 3/45511 327/108 |
| 7,113,033 | B2 |   | 9/2006  | Barnett |
| 7,236,018 | B1 |   | 6/2007  | Wang et al. |
| 8,120,426 | B1 |   | 2/2012  | Granger-Jones et al. |
| 8,285,230 | B2 |   | 10/2012 | Komori |
| 8,446,994 | B2 |   | 5/2013  | Rawlins et al. |
| 8,929,844 | B2 |   | 1/2015  | Mirzaei et al. |
| 8,971,832 | B2 |   | 3/2015  | Bult et al. |
| 9,647,618 | B1 |   | 5/2017  | Yuan et al. |
| 2002/0056137 | A1 | * | 5/2002 | Stewart ..................... H03F 1/34 348/E5.068 |

(Continued)

OTHER PUBLICATIONS

International Search Report and Written Opinion—PCT/US2021/060271—ISA/EPO—dated Mar. 2, 2022.

*Primary Examiner* — Patricia T Nguyen
(74) *Attorney, Agent, or Firm* — Smith Tempel Blaha LLC/Qualcomm

(57) ABSTRACT

An amplifier circuit for a millimeter wave (mmW) communication system includes an amplifier coupled to a matching network, and a variable gain control circuit in the matching network, the variable gain control circuit having an adjustable gain control resistance, the adjustable gain control resistance having adjustable segments and a center node therebetween, the center node coupled to an alternating current (AC) ground.

29 Claims, 10 Drawing Sheets

(56) References Cited

U.S. PATENT DOCUMENTS

| | | | |
|---|---|---|---|
| 2003/0214357 A1* | 11/2003 | Cho | H03G 1/007 330/282 |
| 2016/0020740 A1 | 1/2016 | Arcudia et al. | |
| 2019/0267946 A1 | 8/2019 | Syed et al. | |

* cited by examiner

VARIABLE GAIN CONTROL SYSTEM AND METHOD FOR AN AMPLIFIER

FIELD

The present disclosure relates generally to electronics, and more specifically to amplifiers in communication devices.

BACKGROUND

Wireless communication devices and technologies are becoming ever more prevalent. Wireless communication devices generally transmit and receive communication signals. A communication signal is typically processed by a variety of different components and circuits. One of the circuits that process a communication signal is a transceiver. A transceiver may include a transmitter and a receiver. Some wireless communication devices may be configured to operate on a variety of different communication bands. For example, a modern wireless communication device may be configured to operate on radio spectrum covering both 5G and 4G LTE frequencies. In some instances, a modern wireless communication device may be configured to operate simultaneously on 5G and 4G LTE frequencies in what can be referred to as carrier aggregation (CA) in which a wireless communication device may simultaneously communicate over multiple carriers.

A millimeter-wave (mmW) transmitter typically used in 5G or new radio (NR) communication systems uses a number of transmit chains, each having one or more amplifiers, and each coupled to one or more antenna elements of a phased-array antenna system that may be configured to perform beamforming. Beamforming refers to altering a phase of a transmit and/or a receive signal provided to different antenna elements of the phased-array antenna system to affect the directionality of the resulting communication beam.

It is desirable to have a way to provide fine gain control for a mmW communication system that uses a phased-array antenna system.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier circuit for a millimeter wave (mmW) communication system including an amplifier coupled to a matching network, and a variable gain control circuit in the matching network, the variable gain control circuit having an adjustable gain control resistance, the adjustable gain control resistance having adjustable segments and a center node therebetween, the center node coupled to an alternating current (AC) ground.

Another aspect of the disclosure provides a method for providing amplifier gain control including amplifying a radio frequency (RF) signal with an amplifier circuit, coupling a common mode current to a ground, and independently varying a resistance of adjustable segments of an adjustable gain control resistance.

Another aspect of the disclosure provides a device including means for amplifying a radio frequency (RF) signal, means for means for coupling a common mode current to a ground, and means for independently varying a resistance of adjustable segments of an adjustable gain control resistance.

Another aspect of the disclosure provides a gain control system for an amplifier circuit including a transconductance amplifier coupled to a matching network, the transconductance amplifier comprising n-type metal oxide semiconductor (NMOS) transistor devices, and a variable gain control circuit in the matching network, the variable gain control circuit having an adjustable gain control resistance, the adjustable gain control resistance comprising p-type metal oxide semiconductor (PMOS) transistor devices, the adjustable gain control resistance having adjustable segments and a center node coupled to at least a portion of each of the adjustable segments, the center node further coupled to an alternating current (AC) ground.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a communication system that uses an amplifier coupled to a phased-array antenna system for generating a beamformed communication beam, it may be advantageous to operate the amplifier with fine gain control. For example, when operating an amplifier in a transmitter coupled to a phased-array antenna system at maximum power, that is, where every element of the phased-array is at a maximum power, fine gain control is desirable to provide gain alignment among the elements of the phased-array, and may further allow for maintaining amplifier linearity for the full power condition.

An amplifier used in a mmW communication system may be implemented with a transconductor (a transconductance amplifier), an input load and an output load. Gain control is possible by modifying the transconductor (modifying the current through the transconductance amplifier) and/or by modifying the impedance of the load or by modifying the impedance at the input to the transconductance amplifier.

One conventional way of providing gain control lowers the impedance of the load in differential mode (DM) without significantly affecting the common mode (CM) impedance. As a result, the second harmonic content of the output voltage waveform, $V_{OUT\ 2fo}$, does not change, while the first harmonic content, $V_{OUT\ fo}$, is reduced by the gain control circuit. That is, the output voltage waveform is more distorted when the gain control circuit is enabled.

Exemplary embodiments of the disclosure are directed to a variable gain control system and method that provides fine gain control to an amplifier. In some configurations, the amplifier may be operating in a high or full power condition.

Exemplary embodiments of the disclosure are directed to a variable gain control system and method that provides linear fine gain control to an amplifier that may be coupled to a phased-array antenna system.

Exemplary embodiments of the disclosure are directed to a variable gain control system and method that provides linear fine gain control to an amplifier that may be used in a beamforming application.

Exemplary embodiments of the disclosure are directed to a variable gain control system and method for an amplifier that may be implemented in a matching network in accordance with an exemplary embodiment of the disclosure.

Figure 1:
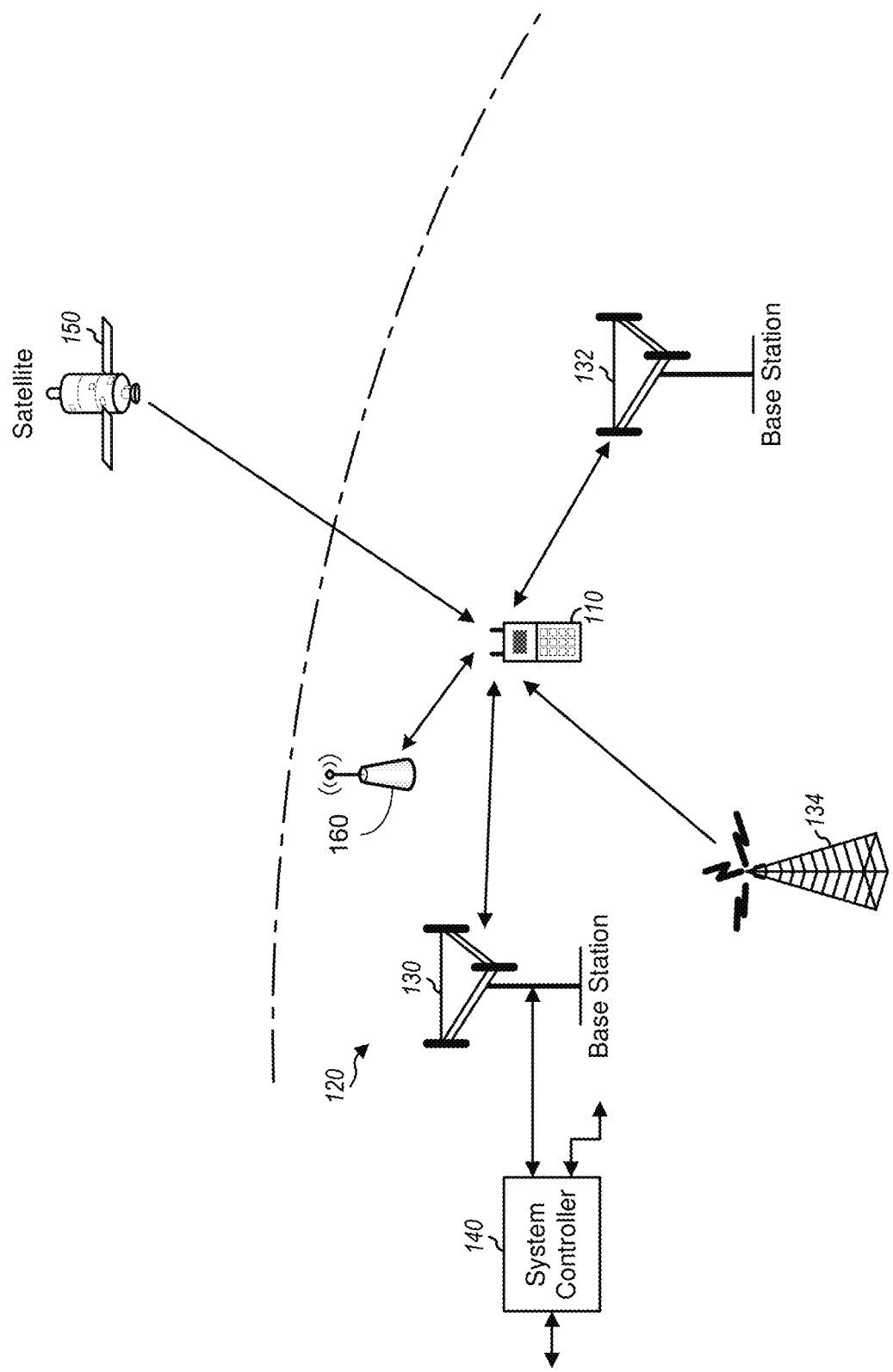
FIG. 1 is a diagram showing a wireless device communicating with a wireless communication system.

FIG. 1 is a diagram showing a wireless device 110 communicating with a wireless communication system 120. The wireless communication system 120 may be a 5G NR (new radio) system, Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as 5G NR, LTE, WCDMA, CDMA 1x, EVDO, TD-SCDMA, GSM, 802.11, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams.

Wireless device 110 may be able to operate in a low-band (LB) covering frequencies lower than 1000 megahertz (MHz), a mid-band (MB) covering frequencies from 1000 MHz to 2300 MHz, and/or a high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 5000 MHz. Low-band, mid-band, and high-band refer to three groups of bands (or band groups), with each band group including a number of frequency bands (or simply, "bands"). Each band may cover up to 200 MHz in some configurations and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11. Wireless device 110 may further be able to operate at frequencies higher than 5000 MHz, for example at frequencies up to 6 or 7 GHz and/or at mmW frequencies. Frequencies of approximately 20 GHz or higher, for example around 24 GHz or higher, may be considered mmW frequencies.

The wireless device 110 may also be in communication with a wireless device 160. In an exemplary embodiment, the wireless device 160 may be a wireless access point, or another wireless communication device that comprises, or comprises part of a wireless local area network (WLAN). An exemplary embodiment of a WLAN signal may include WiFi, or other communication signals that use unlicensed communication spectrum in the range of, for example, 5 GHz to 6 GHz or in mmW frequencies. The wireless device 110 may also be capable of ENDC (E-UTRAN New Radio Dual Connectivity), where the wireless device 110 may simultaneously be in communication with a first base station (for example, an eNodeB) and with a second base station (for example, a gNodeB).

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
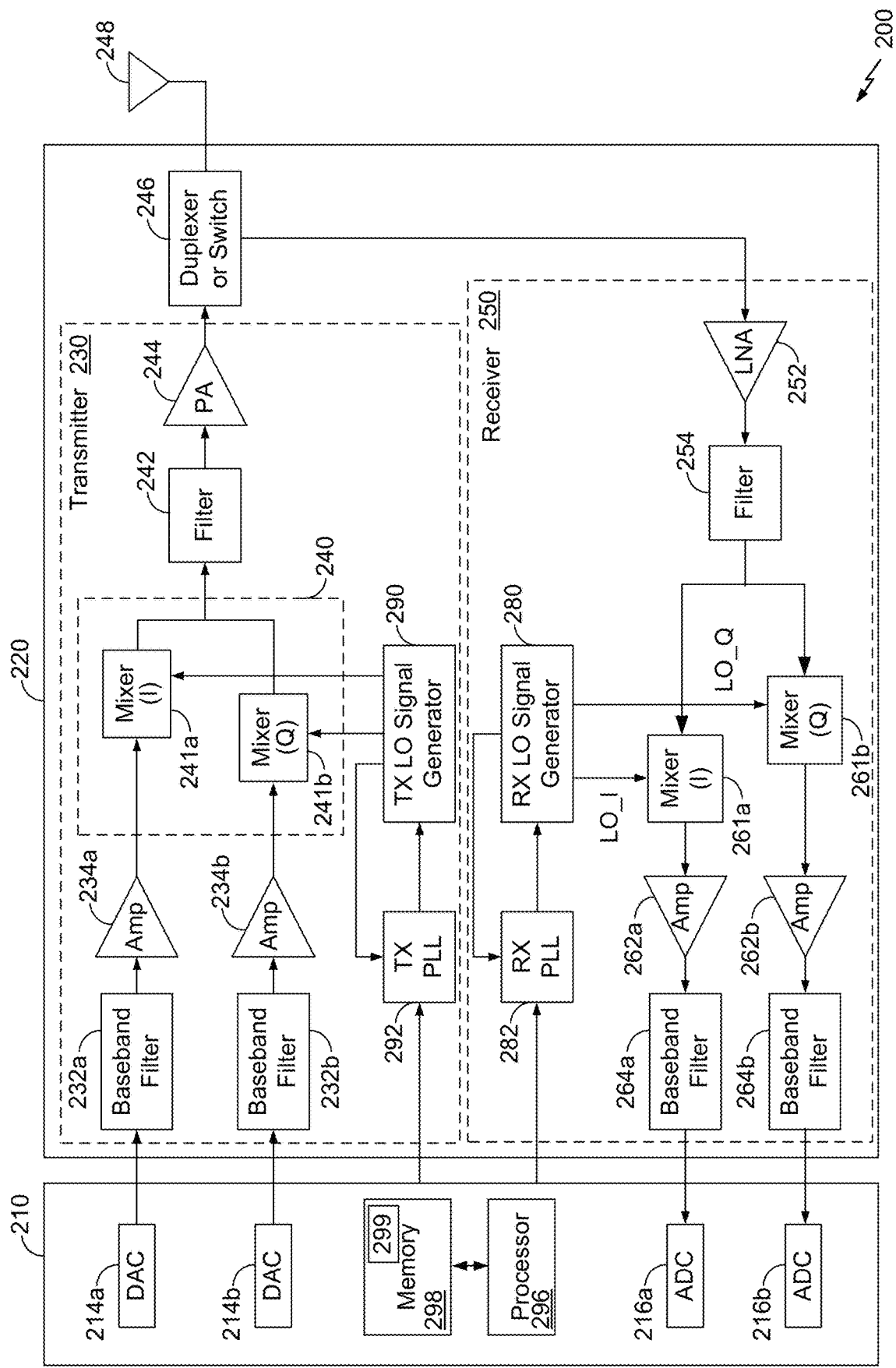
FIG. 2 is a block diagram showing a wireless device in which exemplary techniques of the present disclosure may be implemented.

FIG. 2 is a block diagram showing a wireless device 200 in which the exemplary techniques of the present disclosure may be implemented. The wireless device 200 may be an example of the wireless device 110 in some embodiments. In other embodiments, the wireless device 200 may be an example of one of the base stations, 130, 132, the wireless device 160, a device not illustrated in FIG. 1 such as a customer premises equipment (CPE), etc. FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, as exemplary software or firmware 299, and may generally comprise analog and/or digital processing elements. The processor 296 and the memory 298 may cooperate to control, configure, program, or otherwise fully or partially control some or all of the operation of the embodiments of the amplifier circuit and variable gain control system and method described herein.

The transceiver 220 includes a transmitter 230 and a receiver 250 that support bi-directional communication. In general, wireless device 200 may include any number of transmitters and/or receivers for any number of communication systems and frequency bands. In some embodiments, only a transmitter or only a receiver may be implemented. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband, or near baseband, in one stage. The super-heterodyne and direct-conversion architectures may use different circuit blocks and/or have different requirements. In the example shown in FIG. 2, transmitter 230 and receiver 250 are implemented with the direct-conversion architecture. In other examples, such as the example discussed with respect to FIG. 3, a super-heterodyne architecture may be used.

In the illustrated transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more bias signals and can be configured in various topologies or architectures.

Exemplary embodiments of the variable gain control system and method described herein may be implemented within the power amplifier 244, or within the various amplifier stages of the power amplifier 244.

In the receive path, antenna 248 receives communication signals and provides a received RF signal, which may be routed through duplexer or switch 246 and provided to a low noise amplifier (LNA) 252. The duplexer 246 may be designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally. One or more exemplary embodiments of an inductorless interference cancellation filter may be implemented in the filter 254 of FIG. 2. In some embodiments, the variable gain control system and method described herein may be implemented within the LNA 252.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals on multiple downlink carriers at different frequencies and/or (ii) transmit multiple uplink signals on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the PA 244, the filter 242, the LNA 252, and/or the duplexer 246 may be implemented in separate modules or as discrete components, while the remaining elements illustrated in the transceiver 220 may be implemented in a single transceiver chip. Further, while FIG. 2 illustrates I and Q signals, those of skill in the art will understand that the transceiver 220 may alternatively be implemented using a polar architecture or may include elements to implement a polar architecture in addition to a quadrature architecture.

Figure 3A:
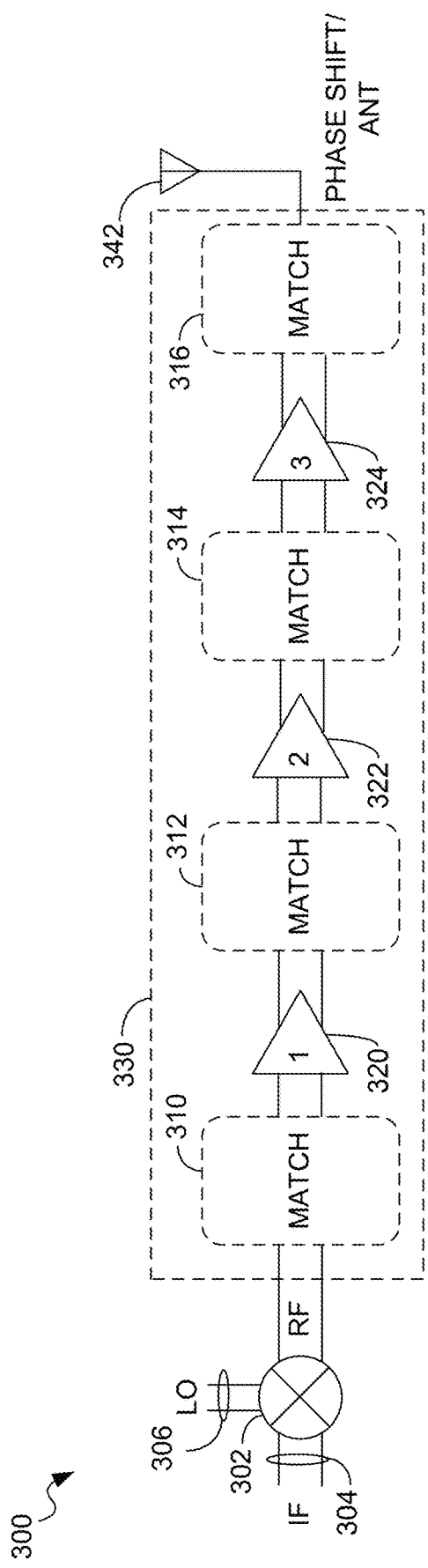
FIG. 3A is a block diagram of at least a portion of an exemplary transmit chain in which exemplary embodiments of the variable gain control system and method may be implemented.

FIG. 3A is a block diagram of at least a portion of an exemplary transmit chain 300 in which exemplary embodiments of the variable gain control system and method may be implemented. In an exemplary embodiment, the transmit chain 300 may be implemented in a mmW communication device that implements a super-heterodyne (superhet) architecture in which a communication signal that is to be transmitted may be converted from a baseband information signal, to an intermediate frequency signal, and then upconverted from the intermediate frequency to a radio frequency signal. Similarly, a received communication signal may be downconverted from an RF signal, to an IF signal, and then further downconverted from the IF signal to a baseband information signal. For example, in some embodiments, an additional mixer (e.g., mixer 302 described below) is implemented between the filter 242 and the PA 244. In some embodiments, another additional mixer is also included between the LNA 252 and the filter 254. In some such embodiments, these additional mixers, the PA 244, and the LNA 252 are implemented in an RFIC separate from an IC on which other elements of the transceiver 220 are implemented. The separate RFIC may be integrated into a module including the antenna 248 in some embodiments. In some embodiments including the additional mixers, an LO for communications in the 20s or 30s of GHz is implemented, and may be included in the RFIC. While the description below includes a superhet architecture, those of skill in the art will understand that embodiments are not limited to amplifiers in such architecture. Further, those of skill in the art will understand that the embodiments described herein may be implemented in an amplifier in a receive chain. The exemplary transmit chain 300 is shown for illustrative purposes only and may comprise a portion of a transmit chain in an mmW communication device.

In an exemplary embodiment, the transmit chain 300 may comprise a mixer 302 configured to receive an intermediate frequency (IF) communication signal over differential connections 304, and a local oscillator (LO) signal over differential connections 306. The mixer 302, using the LO signal, may be configured to upconvert the IF communication signal to a mmW frequency communication signal (referred to in FIG. 3 as an RF signal).

In an exemplary embodiment, the transmit chain 300 may comprise one or more amplifier stages, with three exemplary amplifier stages 320, 322 and 324 shown in FIG. 3 for example only. The three amplifier stages 320, 322 and 324 may be configured to provide the same or different levels of signal amplification. In an exemplary embodiment, the first amplifier stage 320 and the second amplifier stage 322 may be referred to as driver stages, and the third amplifier stage 324 may be referred to as a power amplifier. More or fewer amplifier stages may be included in a transmit chain, depending on application.

In an exemplary embodiment, the transmit chain 300 may comprise one or more matching networks 310, 312, 314 and 316. The matching networks 310, 312, 314 and 316 may be configured to pass an RF signal from one component to another component, such as from the mixer 302 to the amplifier stage 320, from amplifier stage to amplifier stage, and from amplifier stage to a load, such as an antenna, a phase shifter, etc. The matching networks 310, 312, 314 and 316 may each comprise one or more passive and/or active components, such as transistors, resistances, capacitances, inductances (not shown in FIG. 3). In some embodiments, the matching networks 310, 312, 314 and 316 may also comprise transformers (not shown). Although shown in FIG. 3 as being a differential architecture, the transmit chain 300 may also be configured in a single-ended architecture. Further, while three amplifier stages and four matching networks are illustrated in FIG. 3, embodiments may include a greater or fewer number of amplifier stages and matching networks.

In an exemplary embodiment, the matching networks 310, 312, 314 and 316; and the amplifier stages 320, 322 and 324 may comprise a transmit path 330, where one or more transmit paths 330 may be implemented in a phased array architecture. The transmit path 330 may include a fewer or greater number of amplifier stages and/or a fewer or greater number of matching networks in other embodiments.

In an exemplary embodiment, the output of the amplifier stage 324 is shown as being connected through the matching network 316 to an antenna 342. However, in other embodiments, the output of the power amplifier 316 may be coupled to other elements, such as to a phase shifter, to another amplifier, etc.

Exemplary embodiments of the variable gain control system and method described herein may be implemented in one or more of an amplifier, a matching circuit, or in an amplifier circuit that may comprise an amplifier and a matching circuit having the variable gain control system.

Figure 3B:
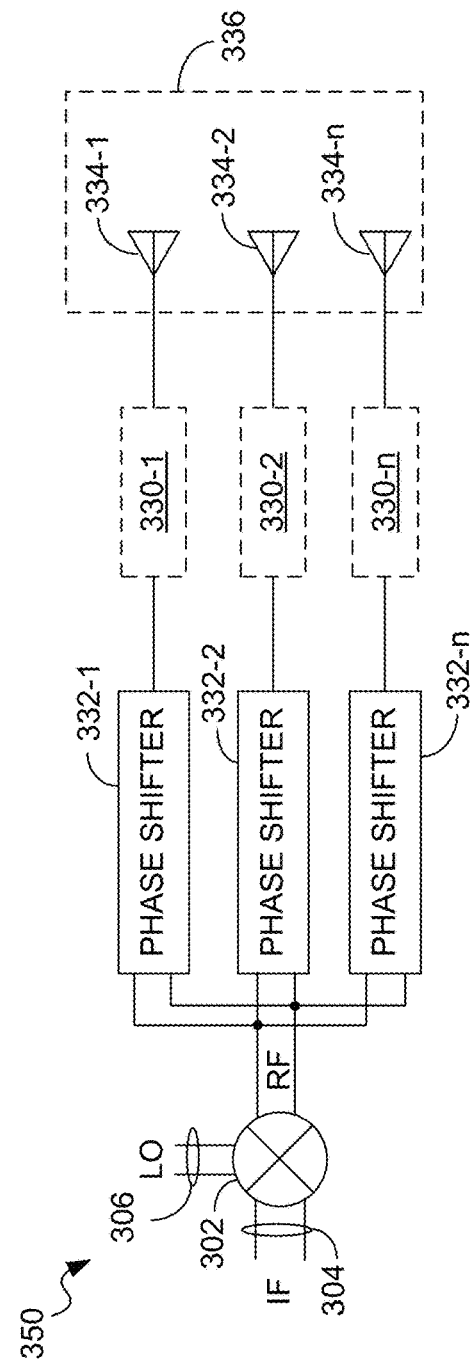
FIG. 3B is a block diagram of at least a portion of an exemplary transmit chain in which exemplary embodiments of the variable gain control system and method may be implemented.

FIG. 3B is a block diagram of at least a portion of an exemplary transmit chain 350 in which exemplary embodiments of the variable gain control system and method may be implemented. The transmit chain 350 is an example of a phased array antenna architecture in which multiple transmit paths 330-1, 330-2 through 330-n may be coupled to the mixer 302. In an exemplary embodiment, the number of transmit paths 330 is dependent upon implementation, with three transmit paths 330-1, 330-2 and 330-n shown for simplicity of illustration.

In an exemplary embodiment, an input of each transmit path 330 is coupled to a respective phase shifter 332, where transmit path 330-1 is coupled to a phase shifter 332-1, transmit path 330-2 is coupled to a phase shifter 332-2 and transmit path 330-n is coupled to a phase shifter 332-n. In an exemplary embodiment, each phase shifter 332 is coupled between the mixer 302 and the respective transmit path 330. In such embodiments, an output of each of the transmit paths 330 is coupled to a respective antenna element 334 in an array 336 of antenna elements. For example, transmit path 330-1 is coupled to antenna element 334-1, transmit path 330-2 is coupled to antenna element 334-2 and transmit path 330-n is coupled to antenna element 334-n.

Figure 4:
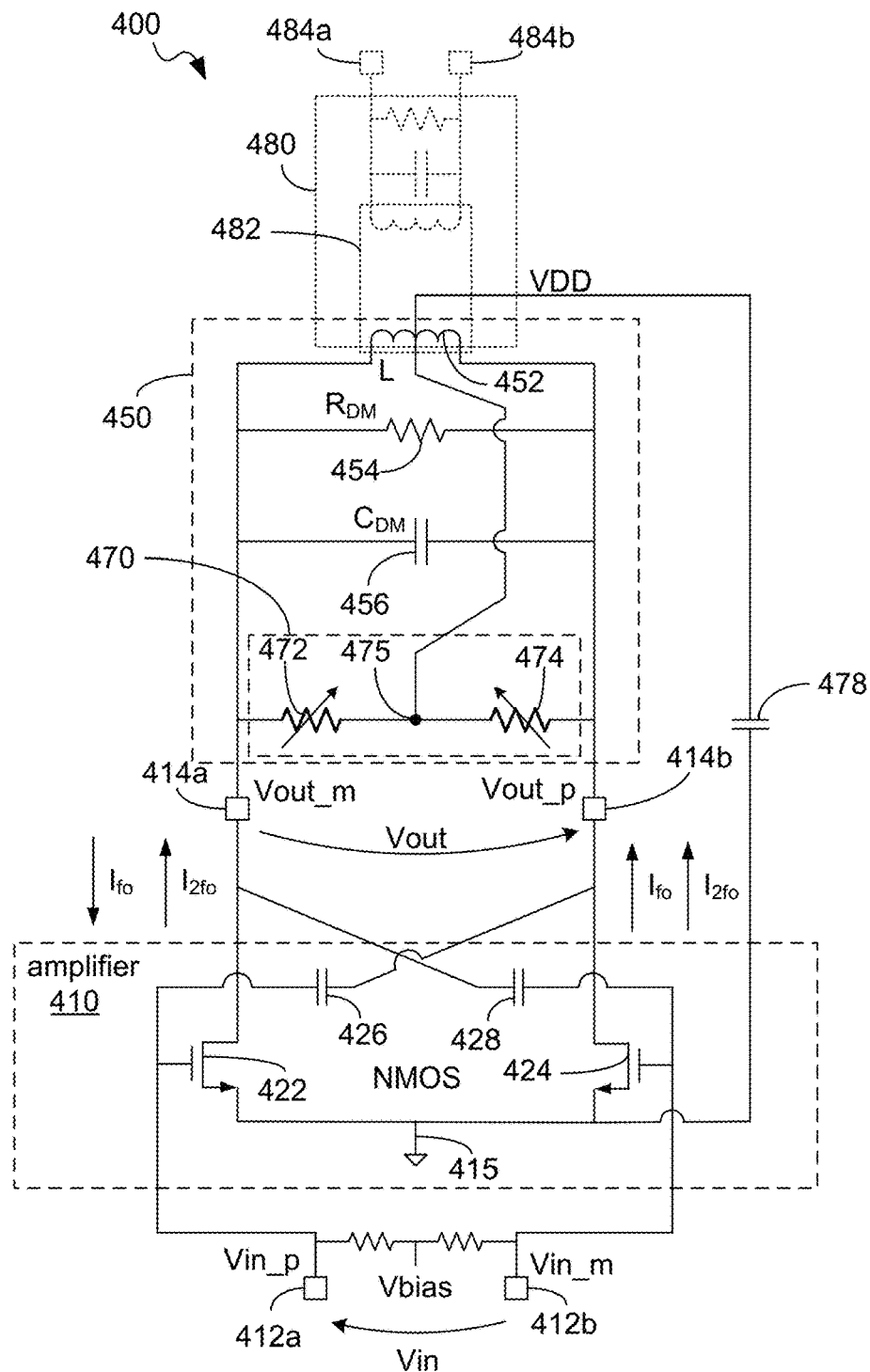
FIG. 4 is a schematic diagram showing an exemplary embodiment of an implementation of an amplifier circuit including an amplifier and a matching network having a variable gain control system in accordance with an exemplary embodiment.

FIG. 4 is a schematic diagram showing an exemplary embodiment of an implementation of an amplifier circuit 400 including an amplifier and a matching network having a variable gain control system in accordance with an exemplary embodiment. The amplifier circuit 400 may be an example of one or more of the amplifiers (320, 322, 324) and matching networks (312, 314, 316) shown in FIG. 3. In an exemplary embodiment, the amplifier circuit 400 may include a variable gain control circuit that may provide fine gain control.

The amplifier circuit 400 includes an amplifier 410, which in an exemplary embodiment can be a transconductance amplifier. The amplifier 410 may be configured to receive a differential input signal at nodes 412a and 412b, and may be configured to provide a differential output signal at nodes 414a and 414b. A DC bias voltage, Vbias, may be provided to the nodes 412a and 412b. The differential input signal may be provided in the form of an input voltage, Vin, for example such that it is also provided to the nodes 412a (Vin_p, or Vin+) and 412b (Vin_m, or Vin−) as an AC radio frequency (RF) input signal.

In an exemplary embodiment, the amplifier 410 may be implemented using n-type metal oxide semiconductor (NMOS) transistors 422 and 424. In an exemplary embodiment, the source of each transistor 422 and 424 may be coupled to system ground and the drain of each transistor 422 and 424 may be coupled to the output nodes 414a and 414b. The capacitances 426 and 428 are optional, and may be implemented in some mmW frequency systems to improve differential mode stability and gain, and are sometimes referred to as neutralization capacitors. In an exemplary embodiment, the capacitances 426 and 428 may be implemented to cancel the effect of gate-source capacitance (Cgs) of the transistor 422 and the transistor 424. In an exemplary embodiment, the capacitance 426 connects the gate of the transistor 422 (Vin_p) to the drain of the transistor 424 (Vout_p) and the capacitance 428 connects the gate of the transistor 424 (Vin_m) to the drain of the transistor 422 (Vout_m). The capacitances 426 and 428 may be realized using discrete capacitors or transistor devices. Although shown in FIG. 4 as being implemented using NMOS transistor devices, the amplifier 410 may also be implemented using PMOS transistor devices, as will be described herein.

The amplifier circuit 400 also includes a matching network 450. In an exemplary embodiment, the matching network 450 may be referred to as a load matching network configured to operate as an output matching network for the amplifier 410. In an exemplary embodiment, the matching network 450 may also be configured with a variable gain control system for providing linear gain control for the amplifier 410. In an exemplary embodiment, the matching network 450 includes a load inductance 452, a differential mode (DM) load resistance ($R_{DM}$) 454 and a differential mode load capacitance ($C_{DM}$) 456. Although shown as discrete elements, the differential mode load resistance ($R_{DM}$) 454 and the differential mode load capacitance ($C_{DM}$) 456 may be created by parasitic resistance and parasitic capacitance generated by the components in the amplifier circuit 400. The matching network 450 may also be implemented using other components, such as, for example, transformers, or other components that may alter the impedance presented to the differential output 414a and 414b of the amplifier 410.

In an exemplary embodiment, the matching network 450 also includes an adjustable gain control resistance 470. In an exemplary embodiment, the adjustable gain control resistance 470 may be referred to as $R_{GC}$, and may comprise one or more adjustable segments. In an exemplary embodiment, the adjustable gain control resistance 470 may comprise two adjustable segments 472 and 474, each having a value $R_{GC}/2$, and a center node 475 therebetween, coupled to at least a portion of each of segments 472 and 474. In some embodiments, the adjustable segments 472 and 474 may be separately adjustable and/or are capable of being adjusted to have different values. In an exemplary embodiment, the resistance provided by each of the adjustable segments 472 and 474 may be independently and selectively adjusted by a respective control signal provided by the data processor 210 of FIG. 2 or by another control unit (not illustrated) disposed elsewhere in the wireless device 200.

In an exemplary embodiment, the center node 475 of the adjustable gain control resistance 470 can be coupled to an alternating current (AC) ground. In an example, the AC ground may be interpreted to include the system voltage VDD. In other exemplary embodiments, the system ground and AC ground may be shorted. A capacitance 478 may appear between the node 475 and system ground 415. In other examples, the AC ground may be provided at locations other than VDD. In the example shown in FIG. 4, the center node 475 is also coupled to a center tap of the inductance 452. In an exemplary embodiment, the adjustable segments 472 and 474 are controlled so as to provide substantially the same resistance.

In an exemplary embodiment, the adjustable gain control resistance 470 can be adjusted by one or more control signals from the data processor 210 (FIG. 2) in differential mode (DM), that is, both adjustable segments 472 and 474 of the adjustable gain control resistance 470 may be selectively adjusted over a range of resistance values, for example to lower the differential mode load impedance, $Z_{DM, fo}$, while allowing the fundamental current, $I_{fo}$ to remain substantially unaffected and while the differential mode output voltage, $V_{OUT, fo}$, decreases, thus providing a variable and in some embodiments, a linear gain control function to the amplifier 410. The output current, that is the fundamental current, $I_{fo}$ and the second harmonic current $I_{2fo}$ is generated by the transconductance of the amplifier 410. Therefore, the output current depends only on the input voltage, Vin, and the transconductance of the amplifier 410 (i.e., the output current does not depend on the output load). Accordingly, when the resistance of the load (Rload including $R_{DM}$ and $R_{GC}$ varies, the output current, Iout, remains unaffected, but the output voltage, Vout, varies with the change in the load according to Vout=Iout*Rload. That is, the output voltage, Vout, varies with the varying resistance of the adjustable gain control resistance 470. In an exemplary embodiment, the center node 475 provides a common mode AC path to ground for the second harmonic current $I_{2fo}$, thus allowing the second harmonic current $I_{2fo}$ a low impedance path to ground, while allowing the common mode output voltage, $V_{OUT, 2fo}$, to decrease linearly or non-linearly for the common mode as well as the differential mode.

In this manner, both the differential mode load impedance ($Z_{DM, fo}$) and the common mode load impedance ($Z_{CM, 2fo}$) can be simultaneously lowered by selectively varying the adjustable gain control resistance 470. An example range of resistance values for the adjustable gain control resistance 470 may be from a low impedance value of about 20 Ohm to a high impedance value of about 2K Ohm. These values are for example only and may differ based on implementation. In an exemplary embodiment, the resistance of the adjustable segments 472 and 474 of the adjustable gain control resistance 470 may be selectively adjusted to be the same resistance value.

In some embodiments, the load inductance 452 may be a primary side of a transformer 482. The transformer 482 may be part of an output circuit 480 in which the output of the amplifier circuit 400 may be taken from the nodes 484a and 484b. The transformer 482 and output circuit 480 are shown in dotted line to indicate that they are optional. However, the linear gain control aspect of the matching network 450 is not dependent on whether the load inductance 452 is implemented as part of a transformer 482. Further, while the transformer 482 and output circuit 480 are not illustrated in subsequent figures, it will be understood that the transformer 482 and/or output circuit 480 may be included in any other embodiment (e.g., embodiments illustrated in FIGS. 5-8) herein.

While the amplifier circuit 400 having the matching network 450 is described in a transmit application, the linear gain control system and method described herein applies to any differential load used for highly linear gain control at mmW frequencies.

Figure 5:
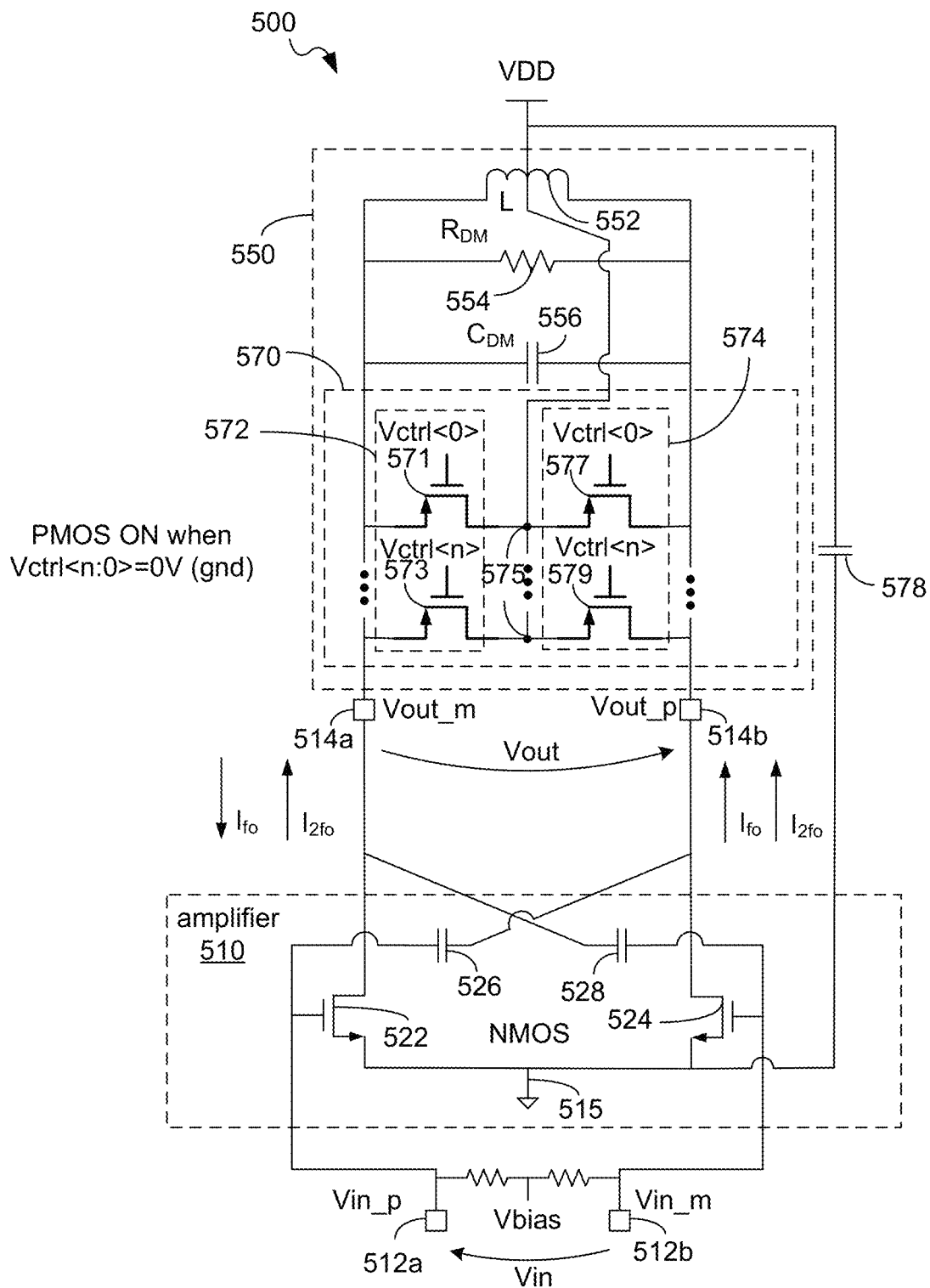
FIG. 5 is a schematic diagram showing an exemplary embodiment of an implementation of an amplifier circuit including an amplifier and a matching network having a variable gain control system in accordance with an exemplary embodiment.

FIG. 5 is a schematic diagram showing an exemplary embodiment of an implementation of an amplifier circuit 500 including an amplifier and a matching network having a variable gain control system in accordance with an exemplary embodiment. The amplifier circuit 500 may be an example of one or more of the amplifiers (320, 322, 324) and matching networks (312, 314, 316) shown in FIG. 3. In an exemplary embodiment, the amplifier circuit 500 may include a variable gain control circuit that may provide fine gain control.

The amplifier circuit 500 includes an amplifier 510, which can be a transconductance amplifier. The amplifier 510 may be configured to receive a differential input signal at nodes 512a and 512b, and may be configured to provide a differential output signal at nodes 514a and 514b. In an exemplary embodiment, the amplifier 510 may be implemented using NMOS transistors 522 and 524. In an exemplary embodiment, the source of each transistor 522 and 524 may be coupled to system ground and the drain of each transistor 522 and 524 may be coupled to the output nodes 514a and 514b. The capacitances 526 and 528 are optional, and may be implemented in some mmW frequency systems to improve differential mode stability and gain, and are sometimes referred to as neutralization capacitors. In an exemplary embodiment, the capacitances 526 and 528 may be implemented to cancel the effect of gate-source capacitance (Cgs) of the transistor 522 and the transistor 524. It an exemplary embodiment, the capacitance 526 connects the gate of the transistor 522 (Vin_p) to the drain of the transistor 524 (Vout_p) and the capacitance 528 connects the gate of the transistor 524 (Vin_m) to the drain of the transistor 522 (Vout_m). The capacitances 526 and 528 may be realized using discrete capacitors or transistor devices.

The amplifier circuit 500 also includes an exemplary embodiment of a matching network 550. In an exemplary embodiment, the matching network 550 may be referred to as a load matching network configured to operate as an output matching network for the amplifier 510. In an exemplary embodiment, the matching network 550 may also be configured to provide linear gain control for the amplifier 510. In an exemplary embodiment, the matching network 550 includes a load inductance 552, a differential mode (DM) load resistance ($R_{DM}$) 554 and a differential mode load capacitance ($C_{DM}$) 556. Although shown as discrete elements, the differential mode load resistance ($R_{DM}$) 554 and the differential mode load capacitance ($C_{DM}$) 556 may be created by parasitic resistance and parasitic capacitance generated by the components in the amplifier circuit 500. The matching network 550 may also be implemented using other components, such as, for example, transformers, or other components that may alter the impedance presented to the differential output 514a and 514b of the amplifier 510.

In an exemplary embodiment, the matching network 550 also includes an adjustable gain control resistance 570. In an exemplary embodiment, the adjustable gain control resistance 570 may be implemented using PMOS transistor devices to realize the adjustable segments 572 and 574. In an exemplary embodiment, the adjustable segment 572 may comprise a number (equal to n+1 in the embodiment illustrated in FIG. 5) of PMOS transistor 571 through 573. In an exemplary embodiment, the adjustable segment 574 may comprise the same number of PMOS transistors, illustrated in FIG. 5 as PMOS transistors 577 through 579. Each of the PMOS transistors 571 through 573 and 577 through 579 are on when the gate voltage (illustrated in FIG. 5 as Vctrl<n:0>) provided to the gate of the respective PMOS transistor 571 through 573 and 577 through 579 is at logic low, or zero volts or below, that is, when the gate of the respective PMOS transistor 571 through 573 and 577 through 579 is coupled to a logic low signal, such as system ground. While FIG. 5 illustrates segments 572 and 574 receiving the same control signal, Vctrl, the segments 572, 574 (or portions thereof) may receive control signals separate and/or different from each other, or may otherwise be separately adjustable.

In an exemplary embodiment, the drain of the transistor 571 is coupled to the source of the transistor 577 and also is coupled to system voltage VDD at the center node 575, which may also be coupled to a center tap of the inductance 552. Similarly, the drain of the transistor 573 is coupled to the source of the transistor 579 and also is coupled to system voltage VDD at the center node 575. In this way, a center node between any two pairs of PMOS transistors in the adjustable gain control resistance 570 may be coupled to VDD. The source of the transistor 571 is coupled to the output node 514a and the source of the transistor 573 is coupled to the output node 514a; and the drain of the transistor 577 is coupled to the output node 514b and the drain of the transistor 579 is coupled to the output node 514b. Similarly, the source of any other transistor in segment 572 may be coupled to the output node 514a and the drain of any other transistor in segment 574 may be coupled to the output node 514b.

The state of the PMOS transistors 571 through 573 and 577 through 579 may be controlled by a control signal from the data processor 210 of FIG. 2 or by another controller (not illustrated) disposed elsewhere in the wireless device 200. In an exemplary embodiment, the resistance provided by the transistors 571 and 577 may be determined by their size; and the resistance provided by the transistors 573 and 579 may also be determined by their size, that is, their width "W" divided by their length "L" (W/L). The on-resistance of the transistors 571, 573, 577 and 579 (and any other transistors in the adjustable gain control resistance 570) is inversely proportional to W/L. In an exemplary embodiment, the size, and therefore the resistance, of each the transistors 571 and 577 may be the same or may be different from one or more other transistors, and similarly the size of each of the transistors 573 and 579 may be the same or may be different from one or more other transistors herein. The size of the transistors 571 through 573, and the size of the transistors 577 through 579 may be the same and there may be an explicit common mode point at node 575 between the transistors 571 and 577 and between the transistors 573 and 579. Therefore, the amount of resistance provided by the separately adjustable segments 572 and 574 may be determined by the size of the transistor devices and the number of transistor devices enabled by the control signal, Vctrl<n:0>, to provide adjustable resistance.

In an exemplary embodiment, the center node 575 of the adjustable gain control resistance 570 can be coupled to an alternating current (AC) ground. In an example, the AC ground may be interpreted to include the system voltage VDD. A capacitance 578 may appear between the node 575 and system ground 515. In other examples, the AC ground may be provided at locations other than VDD.

In an exemplary embodiment, the adjustable gain control resistance 570 can be adjusted by one or more control signals from the data processor 210 (FIG. 2) in differential mode (DM). For example, segments 572 and 574 of the adjustable gain control resistance 570 may be adjusted to lower the differential mode load impedance, $Z_{DM, fo}$, while allowing the fundamental current, $I_{fo}$ to remain substantially unaffected and while the differential mode output voltage, $V_{OUT, fo}$, decreases, thus providing a variable and in some embodiments, linear gain control function to the amplifier 510. The output current, that is the fundamental current, $I_{fo}$ and the second harmonic current $I_{2fo}$ is generated by the transconductance of the amplifier 510. Therefore, the output current depends only on the input voltage, Vin, and the transconductance of the amplifier 510 (i.e., the output current does not depend on the output load). Accordingly, when the resistance of the load (Rload including $R_{DM}$ and $R_{GC}$) varies, the output current, Iout, remains unaffected, but the output voltage, Vout, varies with the change in the load according to Vout=Iout*Rload. That is, the output voltage, Vout, varies with the varying resistance of the adjustable gain control resistance 570. In an exemplary embodiment, the center node 575 provides a common mode AC path to ground for the second harmonic current $I_{2fo}$, thus allowing the second harmonic current $I_{2fo}$ a low impedance path to ground, while allowing the common mode output voltage, $V_{OUT, 2fo}$, to decrease linearly, or non-linearly, for the common mode as well as the differential mode.

In this manner, both the differential mode load impedance ($Z_{DM, fo}$) and the common mode load impedance ($Z_{CM, 2fo}$) can be simultaneously lowered by varying the adjustable gain control resistance 570. An example range of resistance values for the adjustable gain control resistance 570 may be from a low impedance value of about 20 Ohm to a high impedance value of about 2K Ohm. These values are for example only and may differ based on implementation. In an exemplary embodiment, the resistance of the separately adjustable segments 572 and 574 of the adjustable gain control resistance 570 may be selectively adjusted to be the same resistance value.

In the exemplary embodiment shown in FIG. 5, the output circuit 480 shown in FIG. 4, is omitted from FIG. 5 for ease of illustration; however, the output circuit 480 may also be implemented in the amplifier circuit 500 of FIG. 5.

Figure 6:
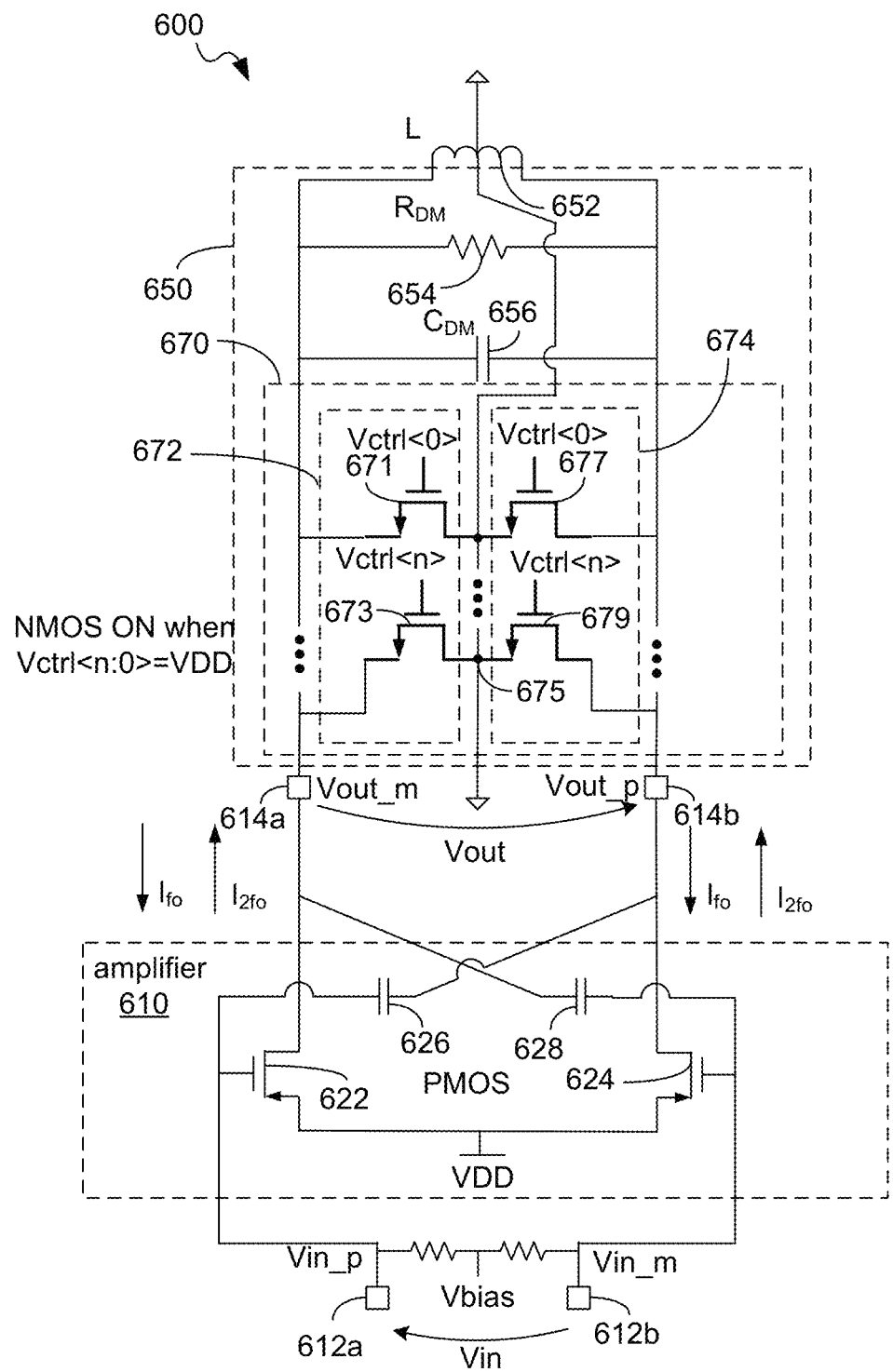
FIG. 6 is a schematic diagram showing an exemplary embodiment of an implementation of an amplifier circuit including an amplifier and a matching network having a variable gain control system in accordance with an exemplary embodiment.

FIG. 6 is a schematic diagram showing an exemplary embodiment of an implementation of an amplifier circuit 600 including an amplifier and a matching network having a variable gain control system in accordance with an exemplary embodiment. The amplifier circuit 600 may be an example of one or more of the amplifiers (320, 322, 324) and matching networks (312, 314, 316) shown in FIG. 3. In an exemplary embodiment, the amplifier circuit 600 may include a variable gain control circuit that may provide fine gain control.

The amplifier circuit 600 includes an amplifier 610, which can be a transconductance amplifier. The amplifier 600 may be implemented using PMOS transistor devices, instead of the NMOS transistor devices used in the amplifier 510 of FIG. 5. The amplifier 610 may be configured to receive a differential input signal at nodes 612a and 612b, and may be configured to provide a differential output signal at nodes 614a and 614b. In an exemplary embodiment, the amplifier 610 may be implemented using PMOS transistors 622 and 624. In an exemplary embodiment, the source of each transistor 622 and 624 may be coupled to system voltage, VDD, and the drain of each transistor 622 and 624 may be coupled to the output nodes 614a and 614b. The capacitances 626 and 628 are optional, and may be implemented in some mmW frequency systems to improve differential mode stability and gain, and are sometimes referred to as neutralization capacitors. In an exemplary embodiment, the capacitances 626 and 628 may be implemented to cancel the effect of gate-source capacitance (Cgs) of the transistor 622 and the transistor 624. It an exemplary embodiment, the capacitance 626 connects the gate of the transistor 622 (Vin_p) to the drain of the transistor 624 (Vout_p) and the capacitance 628 connects the gate of the transistor 624 (Vin_m) to the drain of the transistor 622 (Vout_m). The capacitances 626 and 628 may be realized using discrete capacitors or transistor devices.

The amplifier circuit 600 also includes an exemplary embodiment of a matching network 650. In an exemplary embodiment, the matching network 650 may be referred to as a load matching network configured to operate as an output matching network for the amplifier 610. In an exemplary embodiment, the matching network 650 may also be configured to provide gain control for the amplifier 610. In an exemplary embodiment, the matching network 650 includes a load inductance 652 in which a center node is coupled to system ground, a differential mode (DM) load resistance ($R_{DM}$) 654 and a differential mode load capacitance ($C_{DM}$) 656. Although shown as discrete elements, the differential mode load resistance ($R_{DM}$) 654 and the differential mode load capacitance ($C_{DM}$) 656 may be created by parasitic resistance and parasitic capacitance generated by the components in the amplifier circuit 600. The matching network 650 may also be implemented using other components, such as, for example, transformers, or other components that may alter the impedance presented to the differential output 614a and 614b of the amplifier 610.

In an exemplary embodiment, the matching network 650 also includes an adjustable gain control resistance 670. In an exemplary embodiment, the adjustable gain control resistance 670 may be implemented using NMOS transistor devices to realize separately adjustable segments 672 and 674. In an exemplary embodiment, the separately adjustable segment 672 may comprise a number (equal to n+1 in the embodiment illustrated in FIG. 6) of NMOS transistors 671 through 673. In an exemplary embodiment, the separately adjustable segment 674 may comprise the same number of NMOS transistors, illustrated in FIG. 6 as NMOS transistors 677 through 679. Each of the NMOS transistors 671 through 673 and 677 through 679 are on when the gate voltage (illustrated in FIG. 6 as Vctrl<n:0>) provided to the gate of the respective NMOS transistor 671 through 673 and 677 through 679 is at system voltage, VDD, that is, when the gate of the respective NMOS transistor 671 through 673 and 677 through 679 is coupled to a logic high signal, such as system voltage, VDD. While FIG. 6 illustrates segments 672 and 674 receiving the same control signal, Vctrl, the segments 672, 674 (or portions thereof) may receive control signals separate and/or different from each other, or may otherwise be separately adjustable.

In an exemplary embodiment, the drain of the transistor 671 is coupled to the source of the transistor 677 and also is coupled to system ground at the center node 675. Similarly, the drain of the transistor 673 is coupled to the source of the transistor 679 and also is coupled to system ground at the center node 675. In this way, a center node between any two pairs of NMOS transistors in the adjustable gain control resistance 670 may be coupled to system ground. The source of the transistor 671 is coupled to the output node 614a and the source of the transistor 673 is coupled to the output node 614a. The drain of the transistor 677 is coupled to the output node 614b and the drain of the transistor 679 is coupled to the output node 614b. Similarly, the source of any other transistor in segment 672 may be coupled to the output node 614a and the drain of any other transistor in segment 674 may be coupled to the output node 614b.

The state of the NMOS transistors 671 through 673 and 677 through 679 may be controlled by a control signal from the data processor 210 of FIG. 2 or by another control unit (not illustrated) disposed elsewhere in the wireless device 200. In an exemplary embodiment, the resistance provided by the transistors 671 and 677 may be determined by their size; and the resistance provided by the transistors 673 and 679 may also be determined by their size, that is, their width "W" divided by their length "L" (W/L). The on-resistance of the transistors 671, 673, 677 and 679 (and any other transistors in the adjustable gain control resistance 670) is inversely proportional to W/L. In an exemplary embodiment, the size, and therefore the resistance, of each the transistors 671 and 677 may be the same or may be different from one or more other transistors, and similarly the size of each of the transistors 673 and 679 may be the same or may be different from one or more other transistors. The size of the transistors 671 through 673, and the size of the transistors 677 through 679 may be the same and there may be an explicit common mode point at node 675 between the transistors 671 and 677 and between the transistors 673 and 679. Therefore, the amount of resistance provided by the adjustable segments 672 and 674 may be determined by the size of the transistor devices and the number of transistor devices enabled by the control signal, Vctrl<n:0>, to provide adjustable resistance.

In an exemplary embodiment, the center node 675 of the adjustable gain control resistance 670 can be coupled to an alternating current (AC) ground. In an example, the AC ground may be interpreted to include the system ground.

In an exemplary embodiment, the adjustable gain control resistance 670 can be adjusted by one or more control signals from the data processor 210 (FIG. 2) in differential mode (DM). For example, segments 672 and 674 of the adjustable gain control resistance 670 may be adjusted to lower the differential mode load impedance, $Z_{DM, fo}$, while allowing the fundamental current, $I_{fo}$ to remain substantially unaffected and while the differential mode output voltage, $V_{OUT, fo}$, decreases, thus providing a variable and in some embodiments linear gain control function to the amplifier 610. The output current, that is the fundamental current, $I_{fo}$ and the second harmonic current $I_{2fo}$ is generated by the transconductance of the amplifier 610. Therefore, the output current depends only on the input voltage, Vin, and the transconductance of the amplifier 610 (i.e., the output current does not depend on the output load). Accordingly, when the resistance of the load (Rload including $R_{DM}$ and $R_{GC}$) varies, the output current, Iout, remains unaffected, but the output voltage, Vout, varies with the change in the load according to Vout=Iout*Rload. That is, the output voltage, Vout, varies with the varying resistance of the adjustable gain control resistance 670. In an exemplary embodiment, the center node 675 provides a common mode AC path to ground for the second harmonic current $I_{2fo}$, thus allowing the second harmonic current $I_{2fo}$ a low impedance path to ground, while allowing the common mode output voltage, $V_{OUT, 2fo}$, to decrease linearly, or non-linearly, for the common mode as well as the differential mode.

In this manner, both the differential mode load impedance ($Z_{DM,fo}$) and the common mode load impedance ($Z_{CM, 2 fo}$) can be simultaneously lowered by adjusting the adjustable gain control resistance 670. An example range of resistance values for the adjustable gain control resistance 670 may be from a low impedance value of about 20 Ohm to a high impedance value of about 2K Ohm. These values are for example only and may differ based on implementation. In an exemplary embodiment, the resistance of the separately adjustable segments 672 and 674 of the adjustable gain control resistance 670 may be selectively adjusted to be the same resistance value.

In the exemplary embodiment shown in FIG. 6, the output circuit 480 shown in FIG. 4, is omitted from FIG. 6 for ease of illustration; however, the output circuit 480 may also be implemented in the amplifier circuit 600 of FIG. 6.

Figure 7:
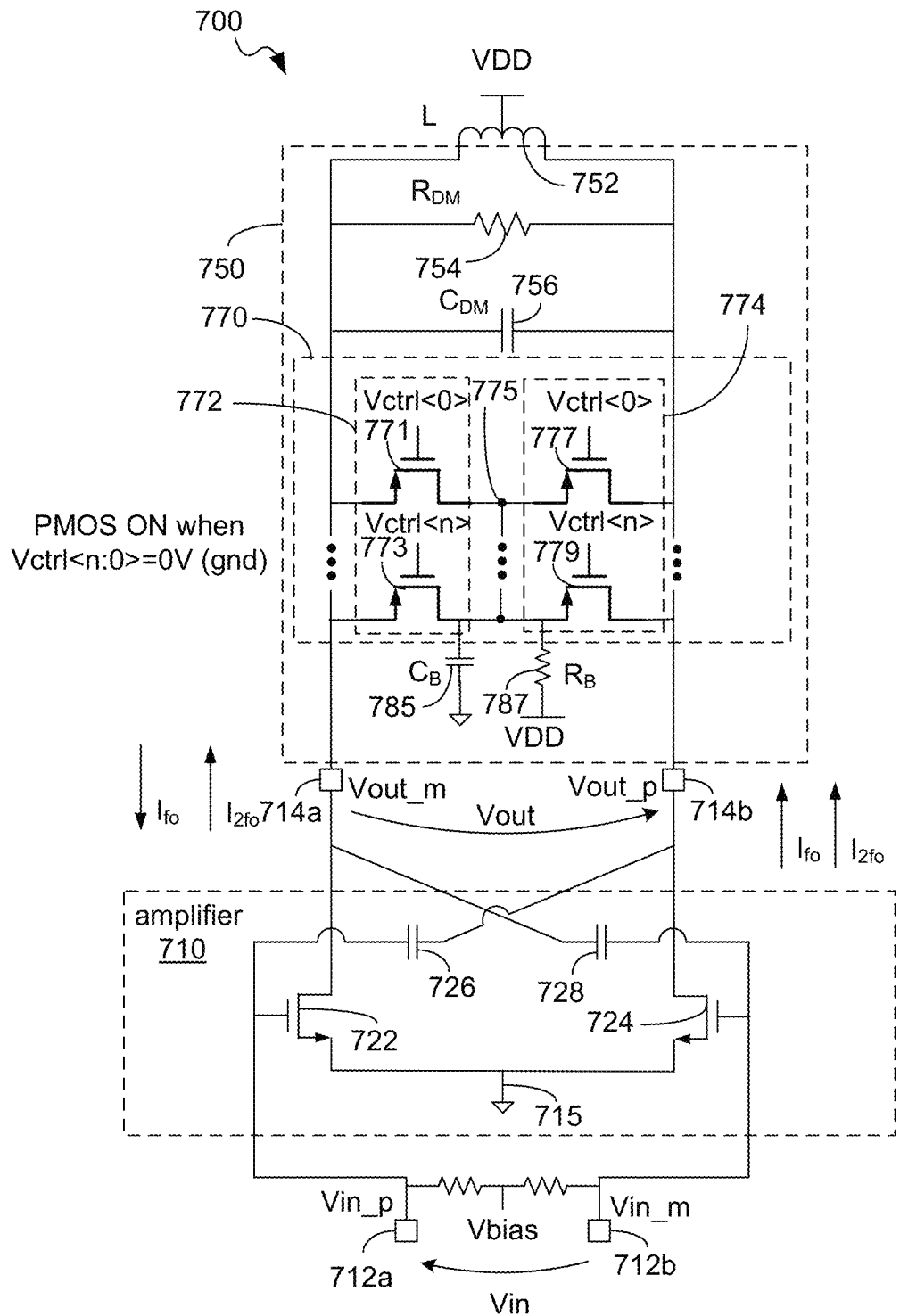
FIG. 7 is a schematic diagram showing an exemplary embodiment of an implementation of an amplifier circuit including an amplifier and a matching network having a variable gain control system in accordance with an exemplary embodiment.

FIG. 7 is a schematic diagram showing an exemplary embodiment of an implementation of an amplifier circuit 700 including an amplifier and a matching network having a variable gain control system in accordance with an exemplary embodiment. The amplifier circuit 700 may be an example of one or more of the amplifiers (320, 322, 324) and matching networks (312, 314, 316) shown in FIG. 3. In an exemplary embodiment, the amplifier circuit 700 may include a variable gain control circuit that may provide fine gain control.

The amplifier circuit 700 includes an amplifier 710, which can be a transconductance amplifier. The amplifier 710 may be configured to receive a differential input signal at nodes 712a and 712b, and may be configured to provide a differential output signal at nodes 714a and 714b. In an exemplary embodiment, the amplifier 710 may be implemented using NMOS transistors 722 and 724. In an exemplary embodiment, the source of each transistor 722 and 724 may be coupled to system ground and the drain of each transistor 722 and 724 may be coupled to the output nodes 714a and 714b. The capacitances 726 and 728 are optional, and may be implemented in some mmW frequency systems to improve differential mode stability and gain, and are sometimes referred to as neutralization capacitors. In an exemplary embodiment, the capacitances 726 and 728 may be implemented to cancel the effect of gate-source capacitance (Cgs) of the transistor 722 and the transistor 724. It an exemplary embodiment, the capacitance 726 connects the gate of the transistor 722 (Vin_p) to the drain of the transistor 724 (Vout_p) and the capacitance 728 connects the gate of the transistor 724 (Vin_m) to the drain of the transistor 722 (Vout_m). The capacitances 726 and 728 may be realized using discrete capacitors or transistor devices.

The amplifier circuit 700 also includes an exemplary embodiment of a matching network 750. In an exemplary embodiment, the matching network 750 may be referred to as a load matching network configured to operate as an output matching network for the amplifier 710. In an exemplary embodiment, the matching network 750 may also be configured to provide gain control for the amplifier 710. In an exemplary embodiment, the matching network 750 includes a load inductance 752, a differential mode (DM) load resistance ($R_{DM}$) 754 and a differential mode load capacitance ($C_{DM}$) 756. Although shown as discrete elements, the differential mode load resistance ($R_{DM}$) 754 and the differential mode load capacitance ($C_{DM}$) 756 may be created by parasitic resistance and parasitic capacitance generated by the components in the amplifier circuit 700. The matching network 750 may also be implemented using other components, such as, for example, transformers, or other components that may alter the impedance presented to the differential output 714a and 714b of the amplifier 710.

In an exemplary embodiment, the matching network 750 also includes an adjustable gain control resistance 770. In an exemplary embodiment, the adjustable gain control resistance 770 may be implemented using PMOS transistor devices to realize adjustable segments 772 and 774. In an exemplary embodiment, the adjustable segment 772 may comprise a number (equal to n+1 in the embodiment illustrated in FIG. 7) of PMOS transistors 771 through 773. In an exemplary embodiment, the separately adjustable segment 774 may comprise the same number of PMOS transistors, illustrated in FIG. 7 as PMOS transistors 777 through 779. Each of the PMOS transistors 771 through 773 and 777 through 779 are on when the gate voltage (illustrated in FIG. 7 as Vctrl<n:0>) provided to the gate of the respective PMOS transistor 771 through 773 and 777 through 779 is at zero volts or lower, that is, when the gate of the respective PMOS transistor 771 through 773 and 777 through 779 is coupled to a logic low signal, such as system ground. While FIG. 7 illustrates segments 772 and 774 receiving the same control signal, Vctrl, the segments 772, 774 (or portions thereof) may receive control signals separate and/or different from each other, or may otherwise be separately adjustable.

In an exemplary embodiment, the drain of the transistor 771 is coupled to the source of the transistor 777 and also is coupled to the center node 775. Similarly, the drain of the transistor 773 is coupled to the source of the transistor 779 and also is coupled to the center node 775. In this way, a center node between all pairs of PMOS transistors in the adjustable gain control resistance 670 may be coupled together.

In the embodiment shown in FIG. 7, separate control of the 1$^{st}$ harmonic termination and the 2$^{nd}$ harmonic termination is provided. For example, the node 775 is coupled to AC ground through a capacitance 785 and the node 775 is coupled to system voltage, VDD, through a resistance 787. The capacitance 785 may be referred to as a bias capacitance, $C_B$, and the resistance 787 may be referred to as a bias resistance, $R_B$. In this exemplary embodiment, for an AC RF input signal, VDD and system ground are considered shorted. In this exemplary embodiment, the center node is DC biased to VDD through the resistor 787. In this manner, there is no DC current flowing through the transistors 771 through 773 or the transistors 777 through 779, and the transistors 771 through 773 and the transistors 777 through 779 operate as switches.

Depending on the actual layout implementation it might be easier to realize a low impedance connection to system ground or to system voltage, VDD. The connection from node 475 to system voltage VDD in the amplifier circuit 400 of FIG. 4 may exhibit a low impedance at a frequency of 2fo. Depending on the circuit layout this might be challenging and or cause coupling issues when circuit connections are routed in top metal in a practical layout. The exemplary embodiment of the amplifier circuit 700 shown in FIG. 7 eliminates such a low impedance connection. In the exemplary embodiment shown in FIG. 7, the system voltage, VDD, provides only a DC voltage to the node 775 through a resistance 787 ($R_B$), to bias the transistors 771 through 773 and 777 through 779. The coupling between the node 775 and VDD may be realized practically with a low-level metal that presents a high impedance, thus eliminating coupling issues. In an exemplary embodiment, the capacitance 785 ($C_B$) is provided to couple the node 775 to system ground to close the loop for the second harmonic current $I_{2fo}$ and to provide a low impedance path to system ground in common mode.

The source of the transistor 771 is coupled to the output node 714a and the source of the transistor 773 is coupled to the output node 714a; and the drain of the transistor 777 is coupled to the output node 714b and the drain of the transistor 779 is coupled to the output node 714b. Similarly, the source of any other transistor in segment 772 may be coupled to the output node 714a and the drain of any other transistor in segment 774 may be coupled to the output node 714b.

The state of the PMOS transistors 771 through 773 and 777 through 779 may be controlled by a control signal from the data processor 210 of FIG. 2 or by another control unit (not illustrated) disposed elsewhere in the wireless device 200. In an exemplary embodiment, the resistance provided by the transistors 771 and 777 may be determined by their size; and the resistance provided by the transistors 773 and 779 may also be determined by their size, that is, their width "W" divided by their length "L" (W/L). The on-resistance of the transistors 771, 773, 777 and 779 (and any other transistors in the adjustable gain control resistance 770) is inversely proportional to W/L. In an exemplary embodiment, the size, and therefore the resistance, of each the transistors 771 and 777 may be the same or may be different from one or more other transistors, and similarly the size of each of the transistors 773 and 779 may be the same or may be different from one or more other transistors. The size of the transistors 771 through 773, and the size of the transistors 777 through 779 may be the same and there may be an explicit common mode point at node 775 between the transistors 771 and 777 and between the transistors 773 and 779. Therefore, the amount of resistance provided by the separately adjustable segments 772 and 774 may be determined by the size of the transistor devices and the number of transistor devices enabled to provide adjustable resistance.

In an exemplary embodiment, the adjustable gain control resistance 770 can be adjusted by one or more control signals from the data processor 210 (FIG. 2) in differential mode (DM). For example, segments 772 and 774 of the adjustable gain control resistance ($R_{GC}/2$) 770 may be adjusted to lower the differential mode load impedance, $Z_{DM, fo}$, while allowing the fundamental current, $I_{fo}$ to remain substantially unaffected and while the differential mode output voltage, $V_{OUT, fo}$, decreases, thus providing a variable and in some embodiments linear gain control function to the amplifier 710. The output current, that is the fundamental current, $I_{fo}$ and the second harmonic current $I_{2fo}$ is generated by the transconductance of the amplifier 710. Therefore, the output current depends only on the input voltage, Vin, and the transconductance of the amplifier 710 (i.e., the output current does not depend on the output load). Accordingly, when the resistance of the load (Rload including $R_{DM}$ and $R_{GC}$) varies, the output current, Iout, remains unaffected, but the output voltage, Vout, varies with the change in the load according to Vout=Iout*Rload. That is, the output voltage, Vout, varies with the varying resistance of the adjustable gain control resistance 770. In an exemplary embodiment, the center node 775 provides a common mode AC path to ground through the capacitance 785 ($C_B$) for the second harmonic current $I_{2fo}$, thus allowing the second harmonic current $I_{2fo}$ a low impedance path to ground, while allowing the common mode output voltage, $V_{OUT, 2fo}$, to decrease linearly or non-linearly for the common mode as well as the differential mode.

In this manner, both the differential mode load impedance ($Z_{DM,fo}$) and the common mode load impedance ($Z_{CM, 2fo}$) can be simultaneously lowered by adjusting the adjustable gain control resistance 770. An example range of resistance values for the adjustable gain control resistance 770 may be from a low impedance value of about 20 Ohm to a high impedance value of about 2K Ohm. These values are for example only and may differ based on implementation. In an exemplary embodiment, the resistance of the separately adjustable segments 772 and 774 of the adjustable gain control resistance 770 may be selectively adjusted to be the same resistance value.

In the exemplary embodiment shown in FIG. 7, the output circuit 480 shown in FIG. 4, is omitted from FIG. 7 for ease of illustration; however, the output circuit 480 may also be implemented in the amplifier circuit 700 of FIG. 7.

Figure 8:
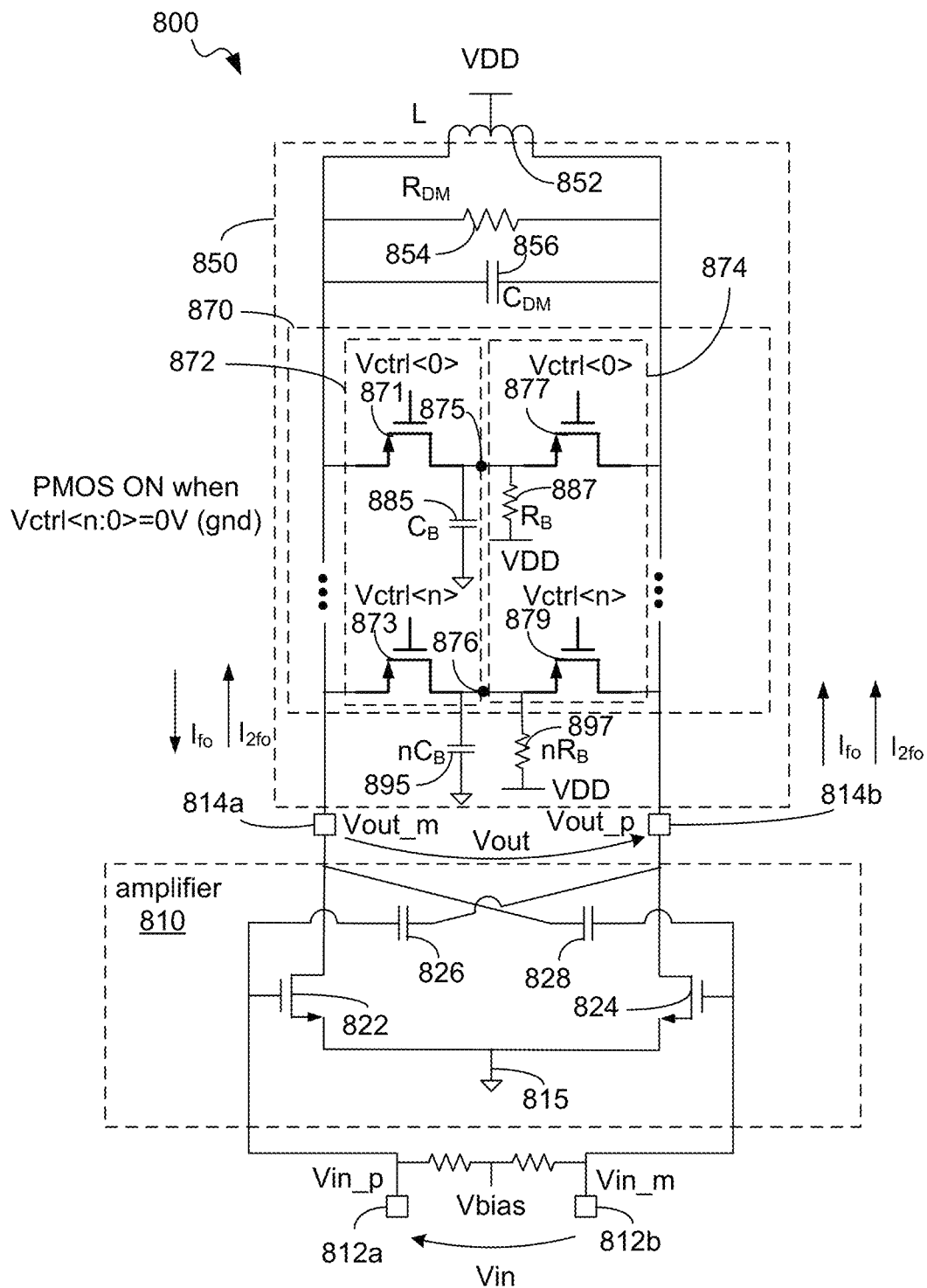
FIG. 8 is a schematic diagram showing an exemplary embodiment of an implementation of an amplifier circuit including an amplifier and a matching network having a variable gain control system in accordance with an exemplary embodiment.

FIG. 8 is a schematic diagram showing an exemplary embodiment of an implementation of an amplifier circuit 800 including an amplifier and a matching network having a variable gain control system in accordance with an exemplary embodiment. The amplifier circuit 800 may be an example of one or more of the amplifiers (320, 322, 324) and matching networks (312, 314, 316) shown in FIG. 3. In an exemplary embodiment, the amplifier circuit 800 may include a variable gain control circuit that may provide fine gain control.

The amplifier circuit 800 includes an amplifier 810, which can be a transconductance amplifier. The amplifier 810 may be configured to receive a differential input signal at nodes 812a and 812b, and may be configured to provide a differential output signal at nodes 814a and 814b. In an exemplary embodiment, the amplifier 810 may be implemented using NMOS transistors 822 and 824. In an exemplary embodiment, the source of each transistor 822 and 824 may be coupled to system ground and the drain of each transistor 822 and 824 may be coupled to the output nodes 814a and 814b. The capacitances 826 and 828 are optional, and may be implemented in some mmW frequency systems to improve differential mode stability and gain, and are sometimes referred to as neutralization capacitors. In an exemplary embodiment, the capacitances 826 and 828 may be implemented to cancel the effect of gate-source capacitance (Cgs) of the transistor 822 and the transistor 824. It an exemplary embodiment, the capacitance 826 connects the gate of the transistor 822 (Vin_p) to the drain of the transistor 824 (Vout_p) and the capacitance 828 connects the gate of the transistor 824 (Vin_m) to the drain of the transistor 822 (Vout_m). The capacitances 826 and 828 may be realized using discrete capacitors or transistor devices.

The amplifier circuit 800 also includes an exemplary embodiment of a matching network 850. In an exemplary embodiment, the matching network 850 may be referred to as a load matching network configured to operate as an output matching network for the amplifier 810. In an exemplary embodiment, the matching network 850 may also be configured to provide gain control for the amplifier 810. In an exemplary embodiment, the matching network 850 includes a load inductance 852, a differential mode (DM) load resistance ($R_{DM}$) 854 and a differential mode load capacitance ($C_{DM}$) 856. Although shown as discrete elements, the differential mode load resistance ($R_{DM}$) 854 and the differential mode load capacitance ($C_{DM}$) 856 may be created by parasitic resistance and parasitic capacitance generated by the components in the amplifier circuit 800. The matching network 850 may also be implemented using other components, such as, for example, transformers, or other components that may alter the impedance presented to the differential output 814a and 814b of the amplifier 810.

In an exemplary embodiment, the matching network 850 also includes an adjustable gain control resistance 870. In an exemplary embodiment, the adjustable gain control resistance 870 may be implemented using PMOS transistor devices to realize separately adjustable segments 872 and 874. In an exemplary embodiment, the separately adjustable segment 872 may comprise a number (equal to n+1 in the embodiment illustrated in FIG. 8) of PMOS transistors 871 through 873. In an exemplary embodiment, the separately adjustable segment 874 may comprise the same number of PMOS transistors, illustrated in FIG. 8 as PMOS transistors 877 through 879. Each of the PMOS transistors 871 through 873 and 877 through 879 are on when the gate voltage (illustrated in FIG. 8 as Vctrl<n:0>) provided to the gate of the respective PMOS transistor 871 through 873 and 877 through 879 is at zero volts or lower, that is, when the gate of the respective PMOS transistor 871 through 873 and 877 through 879 is coupled to a logic low signal, such as system ground. While FIG. 8 illustrates segments 872 and 874 receiving the same control signal, Vctrl, the segments 872, 874 (or portions thereof) may receive control signals separate and/or different from each other, or may otherwise be separately adjustable.

In an exemplary embodiment, the drain of the transistor 871 is coupled to the source of the transistor 877 and also is coupled to a node 875. Similarly, the drain of the transistor 873 is coupled to the source of the transistor 879 and also is coupled to a node 876.

In the embodiment shown in FIG. 8, separate control of the $1^{st}$ harmonic termination and the $2^{nd}$ harmonic termination is provided. For example, the node 875 is coupled to AC ground through a capacitance 885 and the node 875 is coupled to system voltage, VDD, through a resistance 887. The capacitance 885 may be referred to as a bias capacitance, $C_B$, and the resistance 887 may be referred to as a bias resistance, $R_B$. Similarly, the node 876 is coupled to AC ground through a capacitance 895 and the node 876 is coupled to system voltage, VDD, through a resistance 897. The capacitance 895 may be referred to as the nth bias capacitance, $nC_B$, and the resistance 897 may be referred to as the nth bias resistance, $nR_B$. It will be understood that a center node between each pair of PMOS transistors in the adjustable gain control resistance 870 may be coupled to system ground through a respective capacitor and to system voltage, VDD, through a respective resistor.

Similar to the amplifier circuit 700 of FIG. 7, depending on the actual layout implementation it might be easier to realize a low impedance connection to system ground or to system voltage, VDD. The connection from node 475 to system voltage VDD in the amplifier circuit 400 of FIG. 4 may exhibit a low impedance at a frequency of 2fo. Depending on the circuit layout this might be challenging and/or cause coupling issues when circuit connections are routed in top metal in a practical layout. The exemplary embodiment of the amplifier circuit 800 shown in in FIG. 8, similar to FIG. 7, eliminates such a low impedance connection. In the exemplary embodiment shown in FIG. 8, the system voltage, VDD, provides only a DC voltage separately to the node 875 through a resistance 887 ($R_B$), and separately provides a DC voltage to the node 876 through a resistance 897 ($nR_B$), (to bias the transistors 871 and 877 separately from biasing the transistors 873 and 879). The coupling between the node 875 and VDD, and the coupling between the node 876 and VDD may be realized practically with a low-level metal that presents a high impedance, thus eliminating coupling issues. To close the loop for the second harmonic current $I_{2fo}$ and to provide a low impedance path to system ground in common mode, the capacitance 885 ($C_B$) is provided to couple the node 875 to system ground and the capacitance 895 ($nC_B$) is provided to couple the node 876 to system ground. In this manner, the common mode impedance may be separately controlled by separately controlled instances of transistor pairs in the adjustable gain control resistance 870.

The amplifier circuit 800 of FIG. 8 is similar to the amplifier circuit 700 of FIG. 7. However, in the amplifier circuit 700 of FIG. 7, the common mode impedance presented to the amplifier 700 depends only on the transistors (771 through 773 and 777 through 779) in the adjustable gain control resistance 770. In the exemplary embodiment of the amplifier circuit 800 shown in FIG. 8, the common mode impedance presented to the amplifier 800 depends also on the various $C_B$ through $nC_B$, and $R_B$ through $nR_B$ circuits that are enabled separately with the transistors in the adjustable segment 872 and the adjustable segment 874.

The source of the transistor 871 is coupled to the output node 814a and the source of the transistor 873 is coupled to the output node 814a; and the drain of the transistor 877 is coupled to the output node 814b and the drain of the transistor 879 is coupled to the output node 814b. Similarly, the source of any other transistor in segment 872 may be coupled to the output node 814a and the drain of any other transistor in segment 874 may be coupled to the output node 814b.

The state of the PMOS transistors 871 through 873 and 877 through 879 may be controlled by a control signal from the data processor 210 of FIG. 2 or by another control circuit (not illustrated) disposed elsewhere in the wireless device 200. In an exemplary embodiment, the resistance provided by the transistors 871 and 877 may be determined by their size; and the resistance provided by the transistors 873 and 879 may also be determined by their size, that is, their width "W" divided by their length "L" (W/L). The on-resistance of the transistors 871, 873, 877 and 879 (and any other transistors in the adjustable gain control resistance 770) is inversely proportional to W/L. In an exemplary embodiment, the size, and therefore the resistance, of each the transistors 871 and 877 may be the same or may be different from one or more other transistors, and similarly the size of each of the transistors 873 and 879 may be the same or may be different from one or more other transistors. The size of the transistors 871 through 873, and the size of the transistors 877 through 879 may be the same and there may be an explicit common mode point at node 875 between the transistors 871 and 877 and an explicit common mode point at node 876 between the transistors 873 and 879. Therefore, the amount of resistance provided by the adjustable segments 872 and 874 may be determined by the size of the transistor devices and the number of transistor devices enabled by the control signal(s) (e.g., Vctrl<n:0>) to provide adjustable resistance.

In an exemplary embodiment, the adjustable gain control resistance 870 can be adjusted by one or more control signals from the data processor 210 (FIG. 2) in differential mode (DM). For example, segments 872 and 874 of the adjustable gain control resistance 870 may be adjusted to lower the differential mode load impedance, $Z_{DM,\, fo}$, while allowing the fundamental current, $I_{fo}$ to remain substantially unaffected and while the differential mode output voltage, $V_{OUT,\, fo}$, decreases, thus providing a variable and in some embodiments linear gain control function to the amplifier 810. The output current, that is the fundamental current, $I_{fo}$ and the second harmonic current $I_{2fo}$ is generated by the transconductance of the amplifier 810. Therefore, the output current depends only on the input voltage, Vin, and the transconductance of the amplifier 810 (i.e., the output current does not depend on the output load). Accordingly, when the resistance of the load (Rload including $R_{DM}$ and $R_{CG}/2$) varies, the output current, Iout, remains unaffected, but the output voltage, Vout, varies with the change in the load according to Vout=Iout*Rload. That is, the output voltage, Vout, varies with the varying resistance of the adjustable gain control resistance 870. In an exemplary embodiment, the center node 875 and the center node 876 separately provide a common mode AC path to ground through the capacitance 885 ($C_B$) and the capacitance 895 ($nC_B$), respectively, for the second harmonic current $I_{2fo}$, thus allowing the second harmonic current $I_{2fo}$ a low impedance path to ground, while allowing the common mode output voltage, $V_{OUT,\, 2fo}$, to decrease linearly, or non-linearly, for the common mode as well as the differential mode.

In this manner, both the differential mode load impedance ($Z_{DM,\, fo}$) and the common mode load impedance ($Z_{CM,\, 2fo}$) can be simultaneously lowered by adjusting the adjustable gain control resistance 870. An example range of resistance values for the adjustable gain control resistance 870 may be from a low impedance value of about 20 Ohm to a high impedance value of about 2K Ohm. These values are for example only and may differ based on implementation. In an exemplary embodiment, the resistance of the separately adjustable segments 872 and 874 of the adjustable gain control resistance ($R_{GC}/2$) 870 may be selectively adjusted to be the same resistance value.

In the exemplary embodiment shown in FIG. 8, the output circuit 480 shown in FIG. 4, is omitted from FIG. 8 for ease of illustration; however, the output circuit 480 may also be implemented in the amplifier circuit 800 of FIG. 8.

Figure 9:
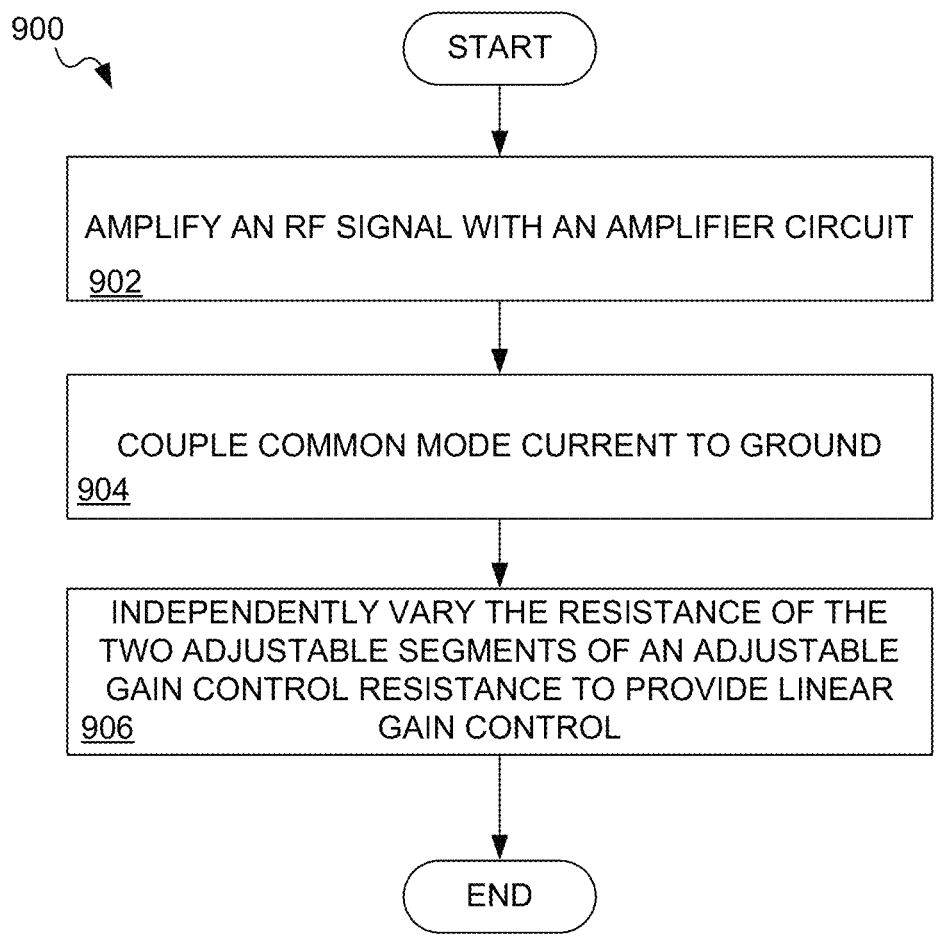
FIG. 9 is a flow chart describing an example of a variable gain control method.

FIG. 9 is a flow chart 900 describing an example of a variable gain control method 900. The blocks in the method 900 can be performed in or out of the order shown, and in some embodiments, can be performed at least in part in parallel.

In block 902, a radio frequency (RF) signal is amplified with an amplifier circuit. For example, the amplifier 410 of FIG. 4 may amplify an RF signal.

In block 904, a common mode current is coupled to ground. For example, a center node 475 may couple a common mode current of the amplifier 410 to system ground or to AC ground.

In block 906, the resistance of each of two adjustable segments may be independently varied to provide linear gain control. For example, the two adjustable segments 472 and 474 of the adjustable gain control resistance 470 may be separately varied.

Figure 10:
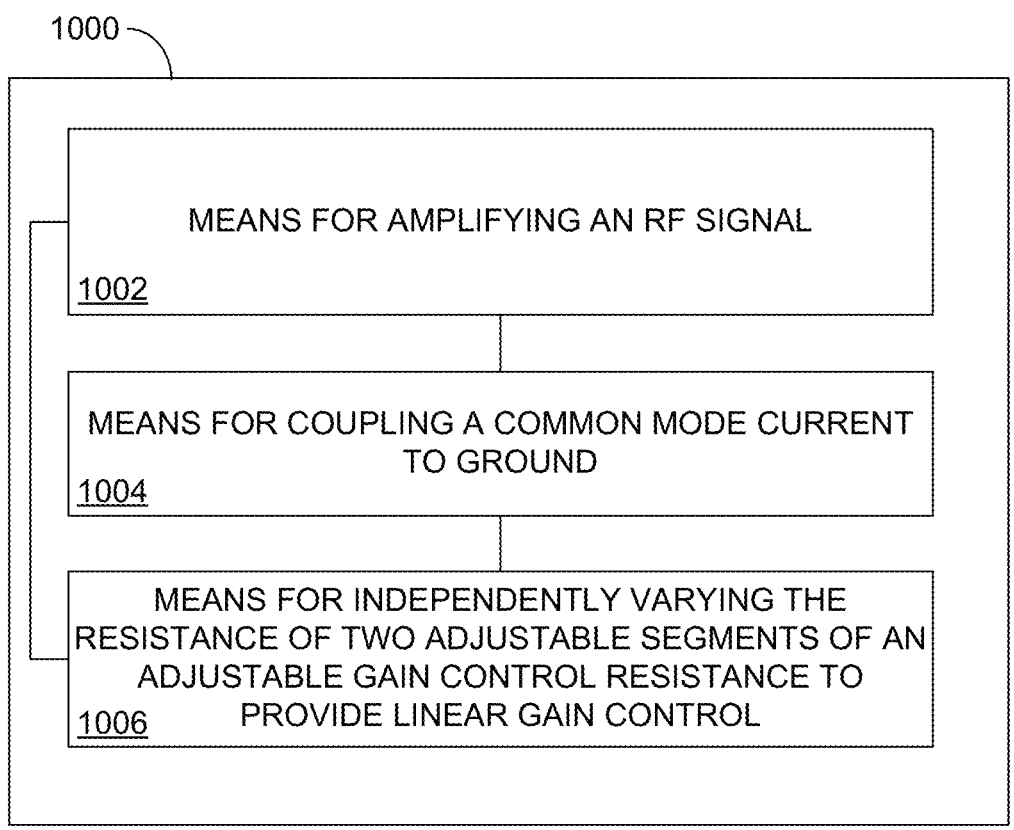
FIG. 10 is a functional block diagram of an apparatus for variable gain control.

FIG. 10 is a functional block diagram of an apparatus 1000 for variable gain control. The apparatus 1000 comprises means 1002 for amplifying a radio frequency (RF) signal. In certain embodiments, the means 1002 for amplifying a radio frequency (RF) signal can be configured to perform one or more of the functions described in operation block 902 of method 900 (FIG. 9). In an exemplary embodiment, the means 1002 for amplifying a radio frequency (RF) signal may comprise the amplifier 410 of FIG. 4, for example configured to amplify an RF signal.

The apparatus 1000 also comprises means 1004 for coupling a common mode current to ground. The means 1004 for coupling a common mode current to ground can be configured to perform one or more of the functions described in operation block 904 of method 900 (FIG. 9). In an exemplary embodiment, the means 1004 for coupling a common mode current to ground may comprise a center node 475, for example configured to couple a common mode current of the amplifier 410 to system ground or to AC ground.

The apparatus 1000 also comprises means 1006 for independently varying the resistance of each of the two adjustable segments to provide linear gain control. The means 1006 for independently varying the resistance of each of the two adjustable segments to provide linear gain control can be configured to perform one or more of the functions described in operation block 906 of method 900 (FIG. 9). In an exemplary embodiment, the means 1006 for independently varying the resistance of each of the two adjustable segments to provide linear gain control may comprise the two adjustable segments 472 and 474 of the adjustable gain control resistance 470 being separately varied.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. An amplifier circuit for a millimeter wave (mmW) communication system, comprising:
   an amplifier coupled to a matching network, the matching network having a load inductance; and
   a variable gain control circuit in the matching network, the variable gain control circuit having an adjustable gain control resistance coupled to the load inductance, the adjustable gain control resistance having adjustable segments and a center node therebetween, the center node coupled to a ground.

2. The amplifier circuit of claim 1, wherein the center node is coupled to a system voltage, VDD.

3. The amplifier circuit of claim 1, wherein the center node is directly coupled to a system ground.

4. The amplifier circuit of claim 1, wherein the center node is coupled to system ground through a capacitance.

5. The amplifier circuit of claim 1, wherein the amplifier is implemented using n-type metal oxide semiconductor (NMOS) transistor devices and the adjustable gain control resistance is implemented using p-type metal oxide semiconductor (PMOS) transistor devices.

6. The amplifier circuit of claim 1, wherein the amplifier is implemented using p-type metal oxide semiconductor (PMOS) transistor devices and the adjustable gain control resistance is implemented using n-type metal oxide semiconductor (NMOS) transistor devices.

7. The amplifier circuit of claim 1, wherein the adjustable segments of the adjustable gain control resistance comprises a plurality of separately adjustable devices.

8. The amplifier circuit of claim 1, wherein each of a plurality of differential gain control resistances has a center node that is independently coupled to the AC ground.

9. The amplifier circuit of claim 1, wherein each of the adjustable segments of the adjustable gain control resistance has the same resistance value.

10. The amplifier circuit of claim 1, wherein the center node is configured to provide a common mode second harmonic current flowing in the amplifier a low impedance path to ground.

11. The amplifier circuit of claim 1, further comprising a mixer configured to convert a radio frequency (RF) input to the amplifier to millimeter wave (mmW).

12. The amplifier circuit of claim 1, wherein the load inductance is configured as a primary side of a transformer, the transformer coupled to another amplifier circuit.

13. The amplifier circuit of claim 1, wherein the amplifier circuit is located in a transmit path of a phased array antenna system.

14. A method for providing amplifier gain control, comprising:
   amplifying a millimeter wave (mmW) signal with an amplifier circuit, the amplifier circuit coupled to a matching network, the matching network having a load inductance;
   coupling a common mode current to a ground through the matching network; and
   independently varying a resistance of adjustable segments of an adjustable gain control resistance coupled to the load inductance.

15. The method of claim 14, further comprising coupling a center node of the adjustable gain control resistance to a system voltage, VDD.

16. The method of claim 14, further comprising coupling a center node of the adjustable gain control resistance directly to a system ground or to a system ground through a capacitance.

17. The method of claim 14, further comprising implementing the amplifier using n-type metal oxide semiconductor (NMOS) transistor devices and implementing the adjustable gain control resistance using p-type metal oxide semiconductor (PMOS) transistor devices.

18. The method of claim 14, further comprising implementing the amplifier using p-type metal oxide semiconductor (PMOS) transistor devices and implementing the adjustable gain control resistance using n-type metal oxide semiconductor (NMOS) transistor devices.

19. The method of claim 14, further comprising implementing each adjustable segment of the adjustable gain control resistance using a plurality of separately adjustable devices.

20. The method of claim 14, further comprising separately coupling a center node of a plurality of adjustable gain control resistances to AC ground.

21. The method of claim 14, further comprising adjusting a resistance of each adjustable segment of the adjustable gain control resistance to have the same resistance value.

22. A device, comprising:
- means for amplifying a millimeter wave (mmW) signal, the amplifying means coupled to a matching means, the matching means having inductive means;
- means for coupling a common mode current to a ground; and
- means for independently varying a resistance of adjustable segments of an adjustable gain control resistance coupled to the inductive means.

23. The device of claim 22, further comprising means for coupling a center node of the adjustable gain control resistance to a system voltage, VDD.

24. The device of claim 22, further comprising means for coupling a center node of the adjustable gain control resistance directly to a system ground or to a system ground through a capacitance.

25. The device of claim 22, wherein the means for amplifying comprises n-type metal oxide semiconductor (NMOS) transistor devices and the means for independently varying a resistance of separately adjustable segments of an adjustable gain control resistance comprises using p-type metal oxide semiconductor (PMOS) transistor devices.

26. The device of claim 22, wherein the means amplifying comprises p-type metal oxide semiconductor (PMOS) transistor devices and the means for independently varying a resistance of separately adjustable segments of an adjustable gain control resistance comprises n-type metal oxide semiconductor (NMOS) transistor devices.

27. The device of claim 22, further comprising means for separately coupling respective center nodes of a plurality of adjustable gain control resistances to AC ground.

28. The device of claim 22, further comprising means for adjusting a resistance of each of the separately adjustable segments to the same resistance value.

29. A gain control system for an amplifier circuit, comprising:
- a transconductance amplifier coupled to a matching network, the transconductance amplifier comprising n-type metal oxide semiconductor (NMOS) transistor devices, the matching network having a load inductance; and
- a variable gain control circuit in the matching network, the variable gain control circuit having an adjustable gain control resistance coupled to the load inductance, the adjustable gain control resistance comprising p-type metal oxide semiconductor (PMOS) transistor devices, the adjustable gain control resistance having adjustable segments and a center node coupled to at least a portion of each of the adjustable segments, the center node further coupled to an alternating current (AC) ground.

* * * * *